(12) United States Patent
Wang et al.

(10) Patent No.: US 10,636,688 B2
(45) Date of Patent: Apr. 28, 2020

(54) METHOD FOR ALIGNMENT, PROCESS TOOL AND METHOD FOR WAFER-LEVEL ALIGNMENT

(71) Applicant: Taiwan Semiconductor Manufacturing Co., Ltd., Hsin-Chu (TW)

(72) Inventors: Ching-Hung Wang, Hsinchu (TW); Ping-Yin Liu, Yonghe (TW); Yeong-Jyh Lin, Caotun Township (TW); Yeur-Luen Tu, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/015,507

(22) Filed: Jun. 22, 2018

(65) Prior Publication Data

US 2019/0393067 A1 Dec. 26, 2019

(51) Int. Cl.
| | | |
|---|---|---|
| *H01L 21/68* | (2006.01) | |
| *H01L 23/544* | (2006.01) | |
| *G01B 11/14* | (2006.01) | |
| *H01L 23/00* | (2006.01) | |

(52) U.S. Cl.
CPC ............ *H01L 21/681* (2013.01); *G01B 11/14* (2013.01); *H01L 23/544* (2013.01); *H01L 24/89* (2013.01); *H01L 24/08* (2013.01); *H01L 2223/5442* (2013.01); *H01L 2223/54426* (2013.01); *H01L 2224/08145* (2013.01); *H01L 2224/8013* (2013.01); *H01L 2224/80895* (2013.01); *H01L 2224/80896* (2013.01)

(58) Field of Classification Search
CPC ..... G01B 11/14; H01L 21/681; H01L 23/544; H01L 24/08; H01L 24/89
See application file for complete search history.

(56) References Cited

U.S. PATENT DOCUMENTS

| | | | |
|---|---|---|---|
| 7,682,933 B1* | 3/2010 | Loomis | H01L 25/50 257/E21.122 |
| 2015/0044786 A1* | 2/2015 | Huang | H01L 24/94 438/14 |
| 2016/0240420 A1* | 8/2016 | Wagenleitner | H01L 21/67092 |
| 2018/0144967 A1* | 5/2018 | Dragoi | H01L 23/544 |
| 2018/0144999 A1* | 5/2018 | Lu | H01L 25/50 |

* cited by examiner

*Primary Examiner* — Eric A. Ward
(74) *Attorney, Agent, or Firm* — Eschweiler & Potashnik, LLC

(57) ABSTRACT

Various embodiments of the present application are directed towards a method for workpiece-level alignment with low alignment error and high throughput. In some embodiments, the method comprises aligning a first alignment mark on a first workpiece to a field of view (FOV) of an imaging device based on feedback from the imaging device, and further aligning a second alignment mark on a second workpiece to the first alignment mark based on feedback from the imaging device. The second workpiece is outside the FOV during the aligning of the first alignment mark. The aligning of the second alignment mark is performed without moving the first alignment mark out of the FOV. Further, the imaging device views the second alignment mark, and further views the first alignment mark through the second workpiece, during the aligning of the second alignment mark. The imaging device may, for example, perform imaging with reflected infrared radiation.

20 Claims, 10 Drawing Sheets

METHOD FOR ALIGNMENT, PROCESS TOOL AND METHOD FOR WAFER-LEVEL ALIGNMENT

BACKGROUND

Wafer-to-wafer (W2W) bonding is a process by which two wafers are bonded together. W2W bonding is often employed during the formation of, among other things, three-dimensional integrated circuits (3DICs), microelectromechanical systems (MEMS) devices, and silicon-on-insulator (SOI) wafers. Wafer-level alignment is a process by which two wafers are aligned and is performed before and/or during W2W bonding to ensure proper alignment. Alignment error may be quantified as the sum of translation error, tool stability error, rotational error, run-out error, and measurement error. Further, translation error, tool stability error, and rotation error are typically the largest contributors to alignment error.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
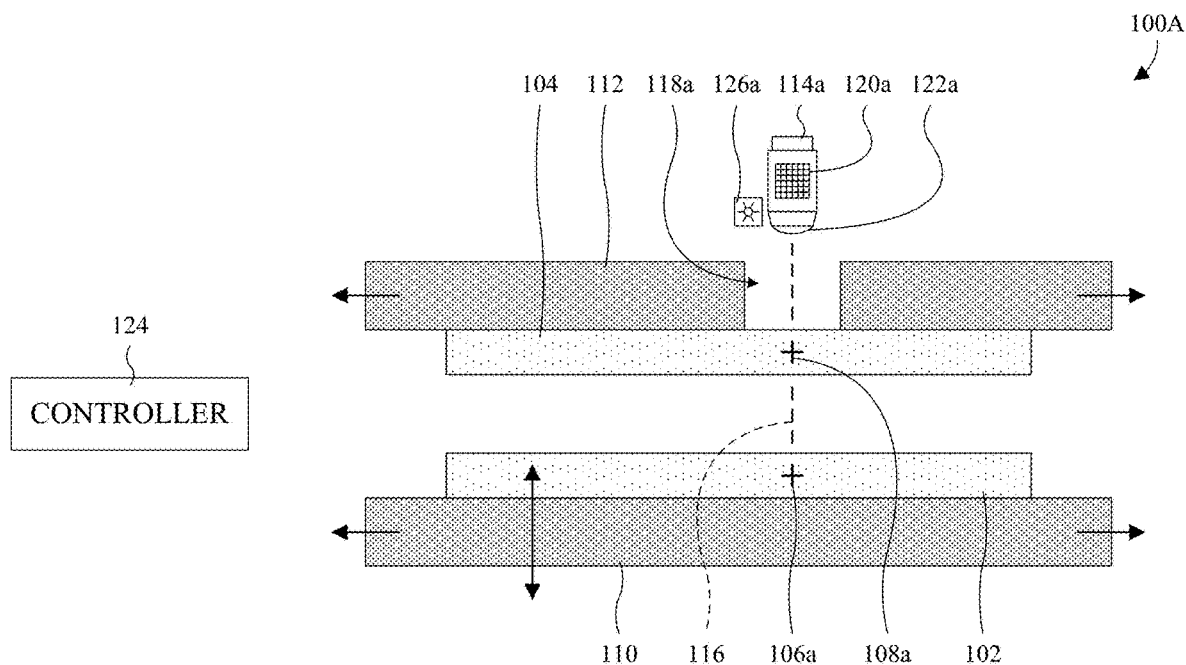
FIGS. 1A and 1B illustrate cross-sectional schematic diagrams of various embodiments of a bond tool with high alignment accuracy and high throughput.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to a method for wafer-level alignment, a top imaging device and a bottom imaging device are focused on a calibration mark. A bottom wafer is moved laterally by a bottom wafer stage until an alignment mark on the bottom wafer is recognized by the top imaging device. The aligned position of the bottom wafer is stored and the bottom wafer is moved out of a field of view of the top imaging device. A top wafer is moved laterally by a top wafer stage until an alignment mark on the top wafer is recognized by the bottom imaging device. The bottom wafer is moved laterally by the bottom wafer stage to the stored position. The top and bottom wafers may then be bonded together.

A challenge with the method for wafer-level alignment is that it has high alignment error and low throughput. The top and bottom imaging devices use visible light, whereby the top and bottom imaging devices are unable to see through the top and bottom wafers. As a result, the alignment mark on the bottom wafer and the alignment on the top wafer cannot be recognized simultaneously. Further, the bottom wafer is moved into its aligned position from memory. In a sense, the bottom wafer is moved into its aligned position blindly since it's done from memory and the top wafer obstructs the top imaging device's view of the bottom wafer. Moving the bottom wafer from its aligned position and then back again from memory introduces a high degree of mechanical or tool stability error and slows throughput.

Another method for wafer-level alignment uses total internal reflection and infrared radiation to align the top wafer and the bottom wafer in a vacuum chamber. The infrared radiation is emitted towards reflectors in a top wafer stage. The infrared radiation undergoes TIR at the reflectors and is reflected downward through the top wafer and the bottom wafer to infrared imaging devices underlying the bottom wafer. A bottom wafer stage moves the bottom wafer based on feedback from the infrared imaging devices to align alignment marks on the bottom wafer respectively to alignment marks on the top wafer. However, a challenge with the method is that it has low throughput.

Various embodiments of the present application are directed towards a method for workpiece-level alignment with low alignment error (i.e., high accuracy) and high throughput, as well as a process tool for performing the method. A workpiece may, for example, be or comprise a wafer. In some embodiments, the method comprises aligning a first alignment mark on a first workpiece to a field of view (FOV) of an imaging device based on feedback from the imaging device, and further comprises aligning a second alignment mark on a second workpiece to the first alignment mark based on feedback from the imaging device. The second workpiece is outside the FOV during the aligning of the first alignment mark. Further, the aligning of the first alignment mark may, for example, be performed by: 1) moving the FOV while the first workpiece remains stationary; 2) moving the first workpiece while the FOV remains stationary; or 3) some other process. The aligning of the second alignment mark is performed without moving the first alignment mark out of the FOV. Further, the imaging device views the second alignment mark, and further views the first alignment mark through the second workpiece, during the aligning of the second alignment mark. In some embodiments, the imaging device uses infrared radiation to view the first and second alignment marks.

By using an imaging device capable of viewing the first alignment mark through the second workpiece during the aligning of the second alignment mark, the first and second alignment marks may be concurrently viewed and alignment between the first and second alignment marks may be based on real time feedback on the locations of the first and second alignment marks. As a result, the number of mechanical movements to perform alignment is low and alignment error is low (i.e., alignment accuracy is high). The low number of mechanical movements, in turn, increases throughput. Further, by using an imaging device capable of viewing the first alignment mark through the second workpiece during the aligning of the second alignment mark, alignment may be performed without multiple imaging devices (e.g., top and bottom imaging devices). This, in turn, reduces costs and system complexity.

With reference to FIG. 1A, a cross-sectional schematic diagram 100A of some embodiments of a bond tool with high alignment accuracy (i.e., low alignment error) and high throughput is provided. The bond tool is configured to align a lower workpiece 102 and an upper workpiece 104 to each other, and to further bond the lower and upper workpieces 102, 104 together. In some embodiments, the aligning and/or the bonding is/are performed at atmospheric pressure or some other pressure. The lower workpiece 102 comprises a lower alignment mark 106a, and the upper workpiece 104 comprises an upper alignment mark 108a. In some embodiments, the lower alignment mark 106a and/or the upper alignment mark 108a is/are cross shaped or some other shape. Further, in some embodiments, the lower and upper alignment marks 106a, 108a are copper, some other metal, or some other material.

A lower workpiece stage 110 is configured to support and move the lower workpiece 102. Further, an upper workpiece stage 112 is over the lower workpiece stage 110 and is configured to support and move the upper workpiece 104. In some embodiments, the lower and upper workpiece stages 110, 112 are associated with or comprise actuators (not shown) to implement the movement of the lower and upper workpieces 102, 104.

An imaging device 114a is over the upper workpiece stage 112 and is oriented so a FOV of the imaging device 114a is directed towards the lower workpiece stage 110. The imaging device 114a is configured to perform imaging using radiation 116 capable of passing through the lower and upper workpieces 102, 104, but not through the lower and upper alignment marks 106a, 108a. This, in turn, allows the imaging device 114a to view and/or image the lower alignment mark 106a through the upper workpiece 104. The radiation 116 may, for example, be or comprise infrared radiation or some other radiation. The infrared radiation may, for example, be or comprise radiation with wavelengths between about 700 nanometers to about 1 millimeter. In some embodiments, the radiation 116 is incapable of passing through the upper workpiece stage 112. In such embodiments, the upper workpiece stage 112 defines an upper alignment opening 118a extending through the upper workpiece stage 112 to allow the radiation 116 to pass through the upper workpiece stage 112. Further, the upper workpiece 104 is placed on the upper workpiece stage 112 so the upper alignment mark 108a is aligned with the upper alignment opening 118a during use of the bond tool. In some embodiments, the radiation 116 is also incapable of passing through the lower workpiece stage 110.

The imaging device 114a comprises an image sensor 120a and, in some embodiments, a lens 122a. The image sensor 120a is configured to sense radiation, such as, for example, radiation reflected off the lower and upper alignment marks 106a, 108a. The image sensor 120a may, for example, be a charge-coupled device (CCD) image sensor, a CMOS image sensor, or some other image sensor. The lens 122a is configured to focus radiation on the image sensor 120a. By focusing radiation on the image sensor 120a, the lens 122a enables finer alignment between the lower and upper workpieces 102, 104. In some embodiments, the lens 122a is also configured to manipulate (e.g., move, reshape, etc.) the FOV of the imaging device 114a. For example, the lens 122a may be a zoom lens, whereby the lens 122a may increase or decrease the focal length of the imaging device 114a. In some embodiments, the imaging device 114a is associated with or comprises actuators enabling electronic control over parameters (e.g., focal length) of the lens 122a. Further, in some embodiments, the imaging device 114a is associated with or comprises actuators enabling movement of the imaging device 114a.

A controller 124 is configured to control components of the bond tool (e.g., the upper workpiece stage 112) to laterally move the lower and upper workpieces 102, 104 into alignment based on feedback from the imaging device 114a. For example, the upper workpiece stage 112 may be controlled to laterally move the upper workpiece stage 112 and, hence, the upper workpiece 104 outside the FOV of the imaging device 114a, the lower alignment mark 106a may then be aligned to the FOV, and the upper workpiece stage 112 may be controlled to laterally move the upper workpiece 104 until the upper alignment mark 108a is aligned to the lower alignment mark 106a in the FOV. The alignment of the lower alignment mark 106a to the FOV may, for example, be performed by: 1) controlling actuators to laterally move the imaging device 114a and, hence, the FOV while the lower workpiece 102 remains stationary; 2) controlling the lower workpiece stage 110 to move the lower workpiece 102 while the FOV and, hence, the imaging device 114a remain stationary; 3) controlling actuators and/or the lens 122a to optically move and/or manipulate the FOV while the imaging device 114a and the lower workpiece 102 remain stationary; or 4) some other process. The alignment of the upper alignment mark 108a may, for example, be performed while the FOV and the lens 122a are fixed.

Because the imaging device 114a may view the lower alignment mark 106a through the upper workpiece 104, the lower and upper alignment marks 106a, 108a may be concurrently viewed and alignment between the lower and upper alignment marks 106a, 108a may be based on real time feedback on locations of the lower and upper alignment marks 106a, 108a. As a result, alignment accuracy is high (i.e., alignment error is low) and the number of mechanical movements to perform alignment is low. The low number of mechanical movements, in turn, leads to high throughput and a low cost of ownership. For example, alignment and bonding may be performed in less than about 160, 140, or 120 seconds.

The controller 124 is further configured to control the lower workpiece stage 110 and/or the upper workpiece stage 112 to vertically move the lower and upper workpieces 102, 104 into contact for bonding after alignment. The bonding may, for example, be performed by fusion bonding, hybrid bonding, or some other bonding.

Functionality of the controller 124 may, for example, be implemented in hardware, software, or a combination of the two. In some embodiments, the controller 124 is or comprises electronic data storage, and further comprises one or more electronic processors configured to execute processor executable instructions that are on the electronic data storage and that implement some or all functionality of the controller 124. In some embodiments, the controller 124 is or comprises an application-specific integrated circuit (ASIC) or some other application-specific hardware implementing some or all functionality of the controller 124.

In some embodiments, a radiation source 126a is over the upper workpiece stage 112. In some embodiments, the radiation source 126a is integrated with the imaging device 114a. In other embodiments, the radiation source 126a is separate from, but adjacent to, the imaging device 114a. The radiation source 126a is configured to emit radiation of the type sensed by the imaging device 114a towards the lower workpiece stage 110 so as to illuminate the FOV of the imaging device 114a. For example, where the imaging device 114a senses infrared radiation, the radiation source 126a may be configured to emit infrared radiation towards the lower workpiece stage 110. In some embodiments, the imaging device 114a senses radiation emitted from the radiation source 126a that is reflected back to the imaging device 114, and the lower and upper alignment marks 106a, 108a are detected by the presence of reflected radiation since the emitted radiation may reflect off the lower and upper alignment marks 106a, 108a.

In some embodiments, each of the lower and upper workpieces 102, 104 is or comprises a silicon wafer or some other wafer. In some embodiments, the lower workpiece 102 is or comprises a silicon wafer or some other wafer, and the upper workpiece 104 comprises a substrate (e.g., a silicon wafer or some other wafer) and an integrated circuit (IC) structure on the substrate, or vice versa. In some embodiments, each of the lower and upper workpieces 102, 104 comprises a substrate (e.g., a silicon wafer or some other wafer) and an IC structure on the substrate. An IC structure comprises semiconductor devices, and further comprises a stack of dielectric and conductive layers stacked on the semiconductor devices. The dielectric and conductive layers may, for example, define an interconnect structure.

In some embodiments, the bond tool is employed for microelectromechanical systems (MEMS) bonding, memory stacking, logic stacking, complementary metal—oxide—semiconductor (CMOS) image sensor bonding, or some other stacking or bonding. For example, where the bond tool is employed for logic stacking, the lower and upper workpieces 102, 104 may be CMOS wafers. As another example, where the bond tool is employed for MEMS bonding, the lower and upper workpieces 102, 104 may, for example, respectively be a CMOS wafer and a bulk silicon wafer.

Figure 1B:
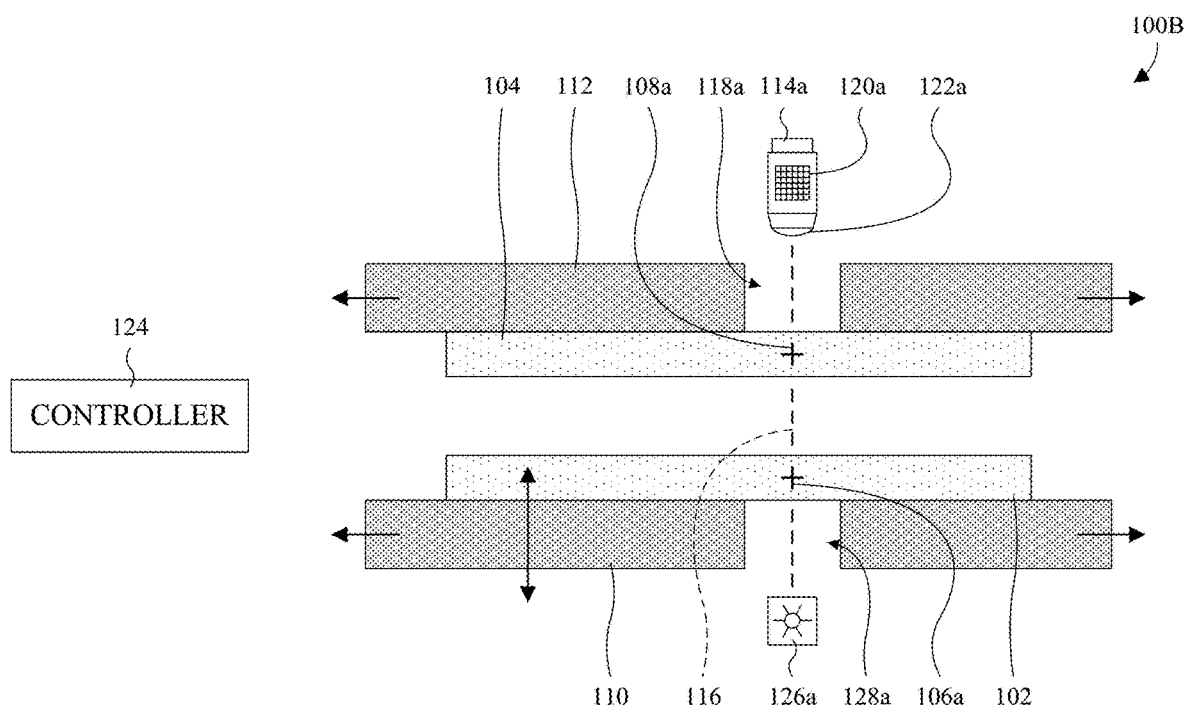

With reference to FIG. 1B, a cross-sectional schematic diagram 100B of some alternative embodiments of the bond tool of FIG. 1A is provided in which the radiation source 126a is below the lower workpiece stage 110. In some embodiments, the imaging device 114a of FIG. 1B senses radiation transmitted through the lower and upper workpieces 102, 104, and the lower and upper alignment marks 106a, 108a may be detected by the absence of transmitted radiation since the radiation emitted by the radiation source 126a may not pass through the lower and upper alignment marks 106a, 108a. In some embodiments, radiation emitted by the radiation source 126a is incapable of passing through the lower workpiece stage 110. In such embodiments, the lower workpiece stage 110 defines a lower alignment opening 128a extending through the lower workpiece stage 110 to allow the emitted radiation to pass through the lower workpiece stage 110 and to illuminate the FOV of the imaging device 114a. Further, the lower workpiece 102 is placed on the lower workpiece stage 110 so the lower alignment mark 106a is aligned with the lower alignment opening 128a during use of the bond tool.

Figure 2A:
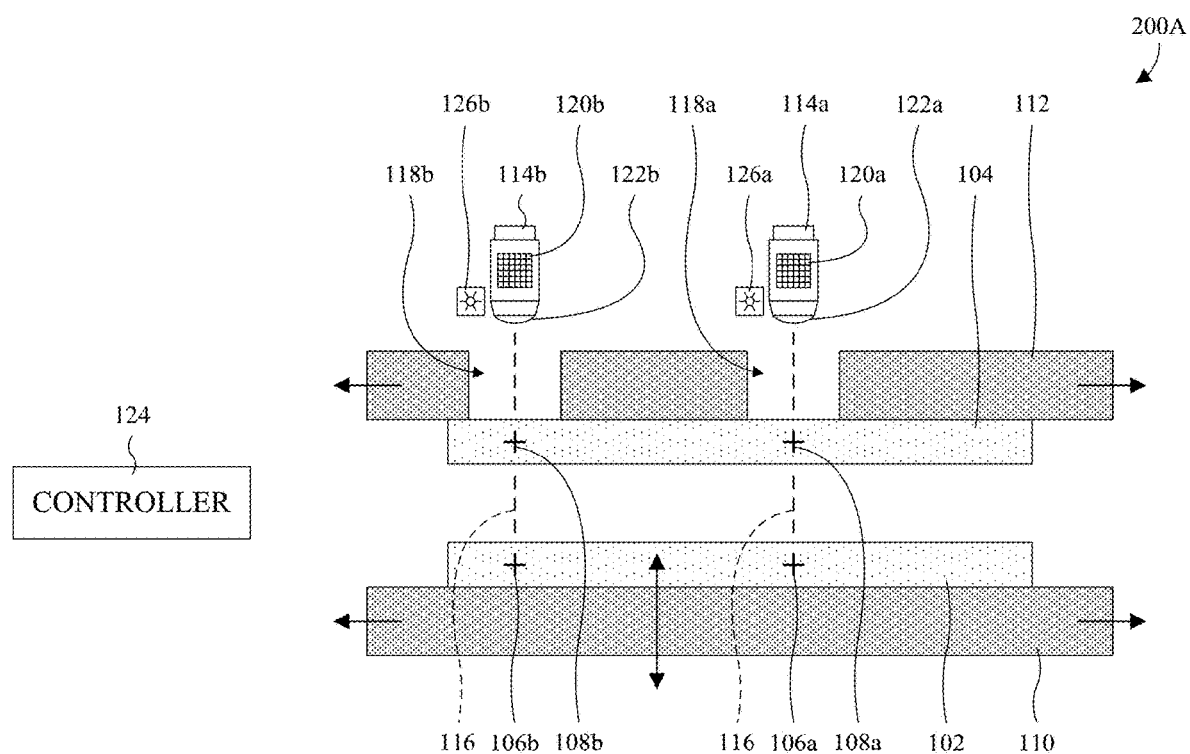
FIGS. 2A and 2B illustrate cross-sectional schematic diagrams of various alternative embodiments of the bond tool of FIGS. 1A and 1B in which the bond tool is configured for alignment at two or more locations.

With reference to FIG. 2A, a cross-sectional schematic diagram 200A of some alternative embodiments of the bond tool of FIG. 1A is provided in which the bond tool is configured for alignment at two or more locations. The lower workpiece 102 comprises the lower alignment mark 106a, and further comprises a second lower alignment mark 106b. The upper workpiece 104 comprises the upper alignment mark 108a, and further comprises a second upper alignment mark 108b. In some embodiments, the second lower alignment mark 106b and/or the second upper alignment mark 108b is/are cross shaped or some other shape. In some embodiments, the second lower alignment mark 106b and/or the second upper alignment mark 108b is/are metal or some other material. In some embodiments, the second lower alignment mark 106b and the lower alignment mark 106a have the same shape, and/or the second upper alignment mark 108b and the upper alignment mark 108a have the same shape.

In addition to the imaging device 114a, a second imaging device 114b is over the upper workpiece stage 112 and is oriented so a FOV of the second imaging device 114b is directed towards the lower workpiece stage 110. The second imaging device 114b is configured to perform imaging using the radiation 116 capable of passing through the upper workpiece 104 to allow the second imaging device 114b to view and/or image the second lower alignment mark 106b through the upper workpiece 104. In some embodiment, the second imaging device 114b is as the imaging device 114a is described with regard to FIG. 1A.

In some embodiments, the radiation 116 is incapable of passing through the upper workpiece stage 112. In such embodiments, the upper workpiece stage 112 defines the upper alignment opening 118a, and further defines a second upper alignment opening 118b. The upper alignment opening 118a and the second upper alignment opening 118b extend through the upper workpiece stage 112 to allow the radiation 116 to pass through the upper workpiece stage 112. During use of the bond tool, the upper workpiece 104 is placed on the upper workpiece stage 112 so the upper alignment mark 108a and the second upper alignment mark 108b are respectively aligned with the upper alignment opening 118a and the second upper alignment opening 118b.

The second imaging device 114b comprises a second image sensor 120b and, in some embodiments, a second lens 122b. The second image sensor 120b is configured to sense radiation, such as, for example, radiation reflected off the second lower and upper alignment marks 106b, 108b. The second image sensor 120b may, for example, be a CCD image sensor, a CMOS image sensor, or some other image sensor. The second lens 122b is configured to focus radiation on the second image sensor 120b. The second lens 122b may, for example, be as the lens 122a is described with regard to FIG. 1A The controller 124 is configured to control components of the bond tool to laterally move the lower and upper workpieces 102, 104 into alignment based on feedback from both the imaging device 114a and the second imaging device 114b. For example, the upper workpiece stage 112 may be controlled to laterally move the upper workpiece stage 112 outside the FOVs of the imaging device 114a and the second imaging device 114b. Then the lower alignment mark 106a and the second lower alignment mark 106b may, for example, be aligned respectively to the FOVs. Then the upper workpiece stage 112 may, for example, be controlled to laterally move the upper workpiece 104 until the upper alignment mark 108a and the second upper alignment mark 108b are respectively aligned to the lower alignment mark 106a and the second lower alignment mark 106b in the FOVs. The alignment of the lower alignment mark 106a and the second lower alignment mark 106b respectively to the FOVs may, for example, be performed by: 1) controlling actuators to laterally move the imaging device 114a and the second imaging device 114b (and hence the FOVs) while the lower workpiece 102 remains stationary; 2) controlling the lower workpiece stage 110 to move the lower workpiece 102 while the FOVs (and hence the first imaging device 114a and the second imaging device 114b) remain stationary; 3) controlling actuators (e.g., actuators associated with or part of the lens 122a and the second lens 122b) to optically move and/or manipulate the FOVs while the imaging device 114a, the second imaging device 114b, and the lower workpiece 102 remain stationary; or 4) some other process. The alignment of the upper alignment mark 108a and the second upper alignment mark 108b may, for example, be performed while the FOV and the lens 122a are fixed. The controller 124 is further configured to control the lower workpiece stage 110 and/or the upper workpiece stage 112 to vertically move the lower and upper workpieces 102, 104 into contact for bonding after alignment.

Because two or more locations are used for alignment, the lower and upper workpieces 102, 104 may be rotationally aligned. Because the imaging device 114a and the second imaging device 114b may respectively view the lower alignment mark 106a and the second lower alignment mark 106b through the upper workpiece 104, the lower and upper alignment marks 106a, 108a and the second lower and upper alignment marks 106b, 108b may be concurrently viewed. As such, alignment between the lower and upper workpieces 102, 104 may be based on real time feedback on locations of the lower and upper alignment marks 106a, 108a and locations of the second lower and upper alignment marks 106b, 108b. As a result, alignment accuracy is high and the number of mechanical movements to perform alignment is low. The low number of mechanical movements, in turn, leads to high throughput and a low cost of ownership.

In some embodiments, in addition to the radiation source 126a, a second radiation source 126b is over the upper workpiece stage 112. The second radiation source 126b is configured to emit radiation of the type sensed by the second imaging device 114b towards the lower workpiece stage 110 so as to illuminate the FOV of the second imaging device 114b. For example, where the second imaging device 114b senses infrared radiation, the second radiation source 126b may be configured to emit infrared radiation towards the lower workpiece stage 110.

Figure 2B:
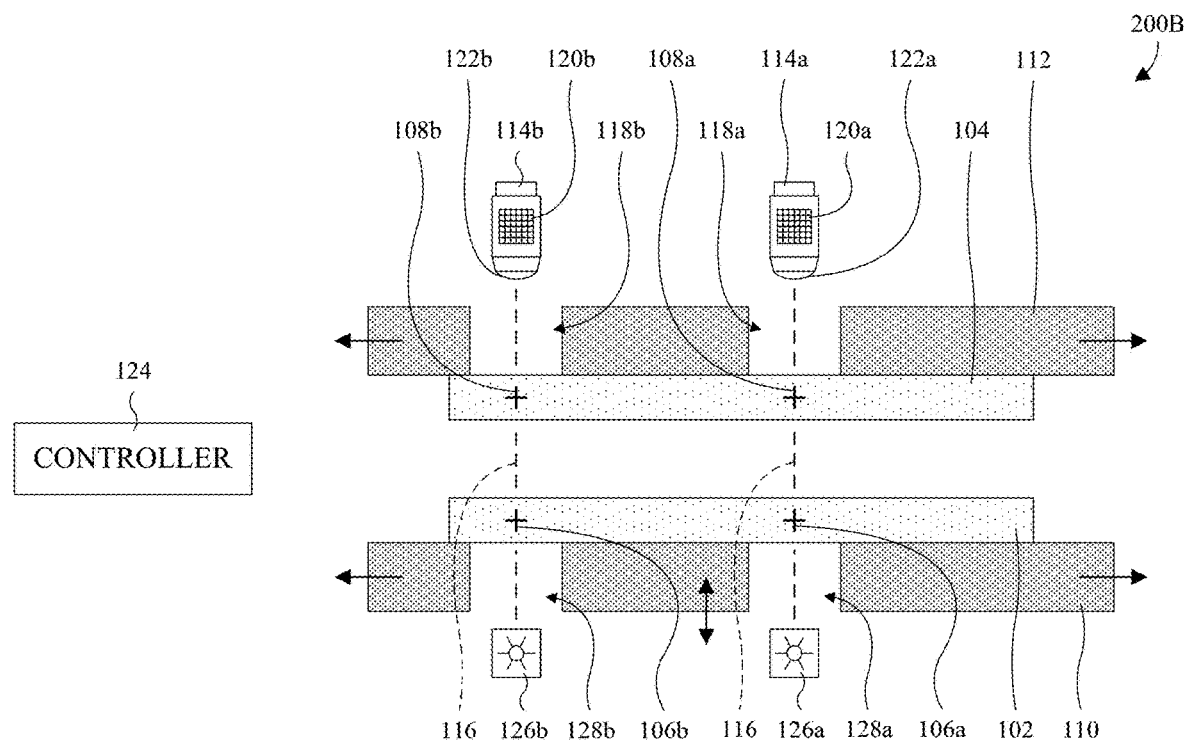

With reference to FIG. 2B, a cross-sectional schematic diagram 200B of some alternative embodiments of the bond tool of FIG. 1B is provided in which alignment is performed at two or more locations. The cross-sectional schematic diagram 200B of FIG. 2B is mostly as the cross-sectional schematic diagram 200A of FIG. 2A is described, except that: 1) the radiation source 126a and the second radiation source 126b are below the lower workpiece stage 110; and 2) the lower workpiece stage 110 has a different configuration in some embodiments.

Radiation emitted by the radiation source 126a and the second radiation source 126b is incapable of passing through the lower workpiece stage 110 in some embodiments. In such embodiments, the lower workpiece stage 110 defines the lower alignment opening 128a, and further defines a second lower alignment opening 128b. The lower alignment opening 128a and the second lower alignment opening 128b extend through the lower workpiece stage 110 to allow the emitted radiation to pass through the lower workpiece stage 110 and illuminate the FOVs of the imaging device 114a and the second imaging device 114b. During use of the bond tool, the lower workpiece 102 is placed on the lower workpiece stage 110 so the lower alignment mark 106a and the second lower alignment mark 106b are respectively aligned with the lower alignment opening 128a and the second lower alignment opening 128b.

Figure 3A:
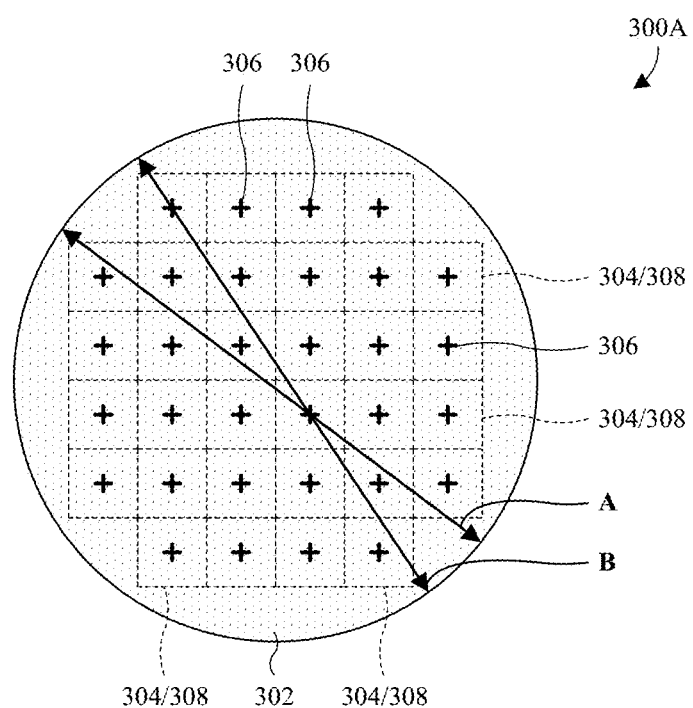
FIGS. 3A-3D illustrate top layouts of various embodiments of a workpiece for use in any one of FIGS. 1A, 1B, 2A, and 2B.

With reference to FIG. 3A, a top layout 300A of some embodiments of a workpiece 302 for use in any one of FIGS. 1A, 1B, 2A, and 2B is provided. In some embodiments, the workpiece 302 is representative of both the lower and upper workpieces 102, 104 in any one of FIGS. 1A, 1B, 2A, and 2B. In some embodiments, the workpiece 302 is representative of the lower workpiece 102, but not the upper workpiece 104, in any one of FIGS. 1A, 1B, 2A, and 2B. In some embodiments, the workpiece 302 is representative of the upper workpiece 104, but not the lower workpiece 102, in any one of FIGS. 1A, 1B, 2A, and 2B.

In embodiments in which the workpiece 302 is representative of the lower workpiece 102 and/or the upper workpiece 104 in FIG. 1A and/or FIG. 1B, the lower workpiece 102 and/or the upper workpiece 104 may, for example, be taken along line A. In embodiments in which the workpiece 302 is representative of the lower workpiece 102 and/or the upper workpiece 104 in FIG. 2A and/or FIG. 2B, the lower workpiece 102 and/or the upper workpiece 104 may, for example, be taken along line B.

The workpiece 302 comprises a plurality of exposure regions 304 and a plurality of alignment marks 306. For ease of illustration, only some of the exposure regions 304 are labeled 304, and only some of the alignment marks 306 are labeled 306. The exposure regions 304 are arranged in grid pattern across the workpiece 302. Each of the exposure regions 304 is a region of the workpiece 302 that a photolithography stepper or scanner stopped at and individually exposed to patterned radiation while stepping across the workpiece 302. The alignment marks 306 facilitate alignment of the workpiece 302 to another workpiece, a reticle, or some other structure. In some embodiments, the alignment marks 306 correspond to the exposure regions 304 with a one-to-one correspondence. Further, in some embodiments, the alignment marks 306 are cross shaped, some other shapes, or any combination of the foregoing.

In some embodiments, the workpiece 302 further comprises a plurality of IC die regions 308 arranged in a grid pattern across the workpiece 302. For ease of illustration, only some of the IC die regions 308 are labeled 308. In some embodiments, the IC die regions 308 correspond to the exposure regions 304 with a one-to-one correspondence. In some embodiments, each of the IC die regions 308 individually has a CMOS image sensor, a MEMS device, a CMOS logic device, a memory device, or some other device.

Figure 3B:
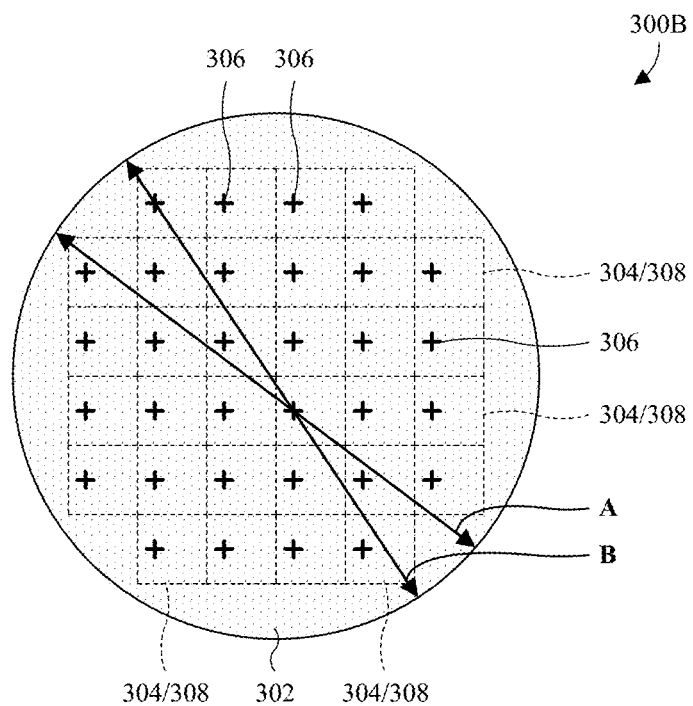

With reference to FIG. 3B, a top view 300B of some alternative embodiments of the workpiece 302 of FIG. 3A is provided in which the alignment marks 306 are laterally offset from centers of corresponding ones of the exposure regions 304.

Figure 3C:
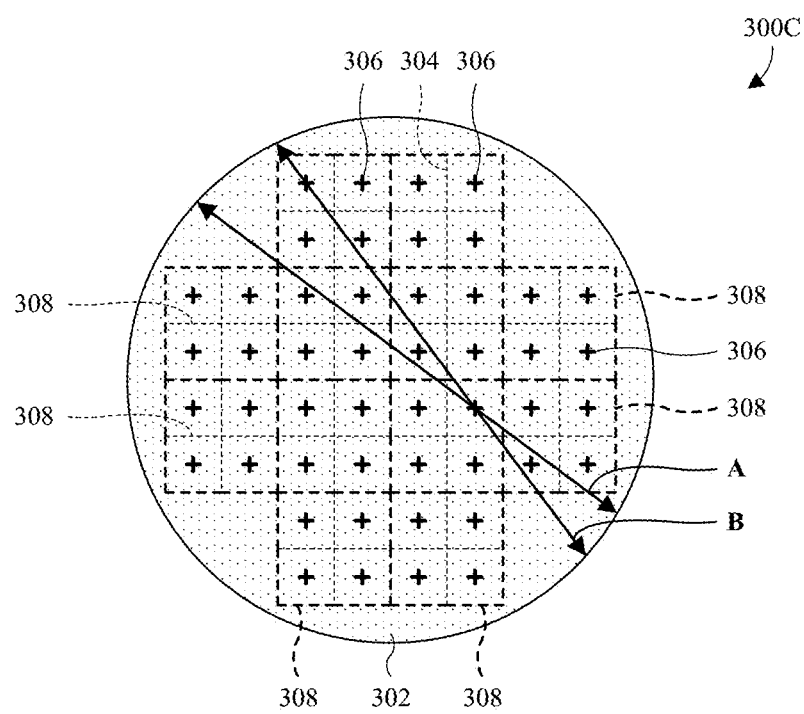

With reference to FIG. 3C, a top view 300C of some alternative embodiments of the workpiece 302 of FIG. 3A is provided in which the IC die regions 308 correspond to the exposure regions 304 with a one-to-many correspondence. For example, each of the IC die regions 308 may correspond to four of the exposure regions 304.

Figure 3D:
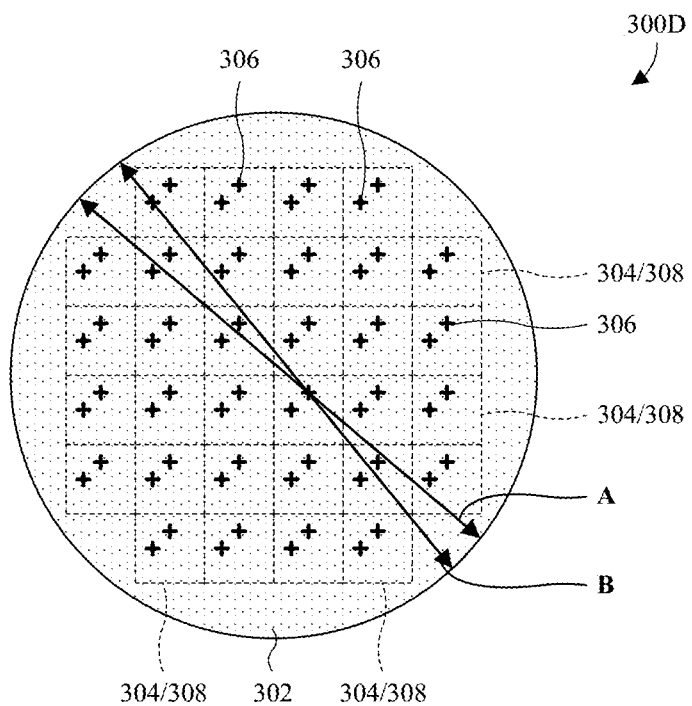

With reference to FIG. 3D, a top view 300D of some alternative embodiments of the workpiece 302 of FIG. 3A is provided in which the alignment marks 306 correspond to the exposure regions 304 with a many-to-one correspondence. For example, there may be two or more alignment marks per exposure area.

Figure 4A:
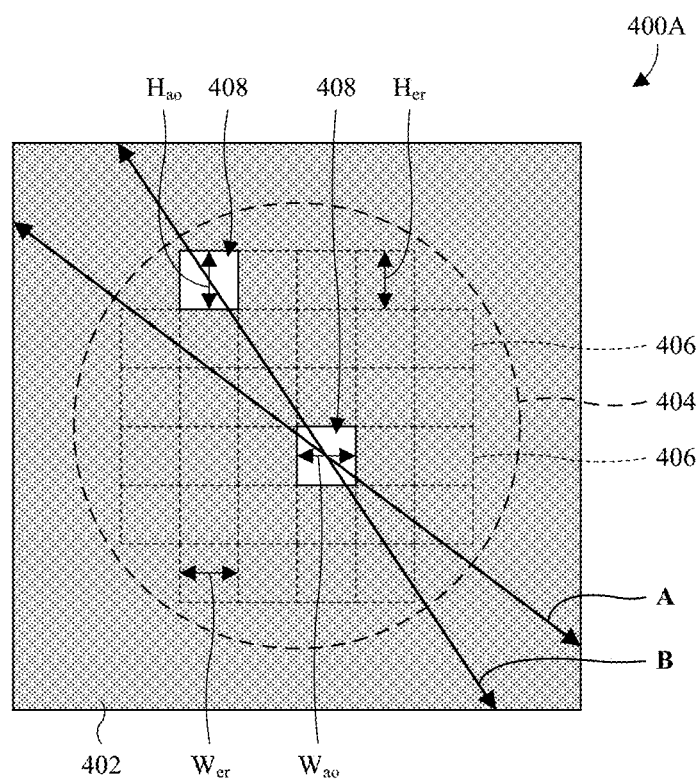
FIGS. 4A and 4B illustrate top layouts of various embodiments of a workpiece stage for use in any one of FIGS. 1A, 1B, 2A, and 2B.

With reference to FIG. 4A, a top layout 400A of some embodiments of a workpiece stage 402 for use in any one of FIGS. 1A, 1B, 2A, and 2B is provided. In some embodiments, the workpiece stage 402 is representative of both the lower and upper workpiece stages 110, 112 in FIG. 1B and/or FIG. 2B. In some embodiments, the workpiece stage 402 is representative of the upper workpiece stage 112, but not the lower workpiece stage 110, in any one of FIGS. 1A, 1B, 2A, and 2B. In some embodiments, the workpiece stage 402 is or is representative of the lower workpiece stage 110, but not the upper workpiece stage 112, in FIG. 1B and/or FIG. 2B.

In embodiments in which the workpiece stage 402 is representative of the lower workpiece stage 110 and/or the upper workpiece stage 112 in FIG. 1A and/or FIG. 1B, the lower workpiece stage 110 and/or the upper workpiece stage 112 may, for example, be taken along line A. In embodiments in which the workpiece stage 402 is representative of the lower workpiece stage 110 and/or the upper workpiece stage 112 in FIG. 2A and/or FIG. 2B, the lower workpiece stage 110 and/or the upper workpiece stage 112 may, for example, be taken along line B.

The workpiece stage 402 is configured to support and move a workpiece 404 (shown in phantom) comprising a plurality of exposure regions 406. For ease of illustration, only some of the exposure regions 406 are labeled 406. The exposure regions 406 are arranged in grid pattern across the workpiece 404, and each of the exposure regions 406 is a region of the workpiece 404 that a photolithography stepper or scanner stopped at and individually exposed to patterned radiation while stepping across the workpiece 404. In some embodiments, the workpiece 404 is as the workpiece 302 is illustrated and/or described in any one of FIGS. 3A-3D. Further, the workpiece stage 402 comprises a plurality of alignment openings 408.

The alignment openings 408 extend through the workpiece stage 402 (i.e., into and out of the page) to enable radiation (e.g., infrared radiation) to pass through the workpiece stage 402. For example, the alignment openings 408 enable radiation from a radiation source (e.g., the radiation source 126a in FIGS. 1B and 2B) to pass through the workpiece stage 402. As another example, the alignment openings 408 enable an imaging device (e.g., the imaging device 114a in FIGS. 1A, 1B, 2A, and 2B) to receive and sense radiation through the workpiece stage 402. In some embodiments, cross sections of the alignment openings 408 are as shown in any one of FIGS. 1A, 1B, 2A, and 2B for the upper alignment opening 118a.

During use of the workpiece stage 402, the workpiece 404 is placed on the workpiece stage 402 so the alignment openings 408 are each aligned to an individual alignment mark on the workpiece. Because the alignment openings 408 enable radiation to pass through the workpiece stage 402, the alignment openings 408 enable alignment marks of the workpiece 404 to be viewed by an imaging device through the workpiece stage 402. This enables alignment of the workpiece 404 to another workpiece (not shown) based on real time feedback on locations of the alignment marks from the imaging device. Further, because the workpiece stage 402 comprises more than one alignment opening, alignment between workpieces may be performed at multiple locations and the workpieces may be rotationally aligned.

In some embodiments, the alignment openings 408 are the same size as, or are larger than, the exposure regions 406 of the workpiece 404 to ensure an imaging device is able to view corresponding alignment marks on the workpiece 404. For example, the alignment openings 408 may have a width $W_{ao}$ that is the same as or greater than a width $W_{er}$ of the exposure regions 406, and/or the alignment openings 408 may have a height $H_{ao}$ that is the same as or greater than a height $H_{er}$ of the exposure regions 406. Further, in some embodiments in which the workpiece stage 402 is used with workpieces with multiple different exposure region sizes, the alignment openings 408 are the same size as, or are larger than, the largest exposure region. In some embodiments, the width $W_{ao}$ of the alignment openings 408 is about 35 millimeters or about 30-40 millimeters. In some embodiments, the height $H_{ao}$ of the alignment openings 408 is about 35 millimeters or about 30-40 millimeters.

Figure 4B:
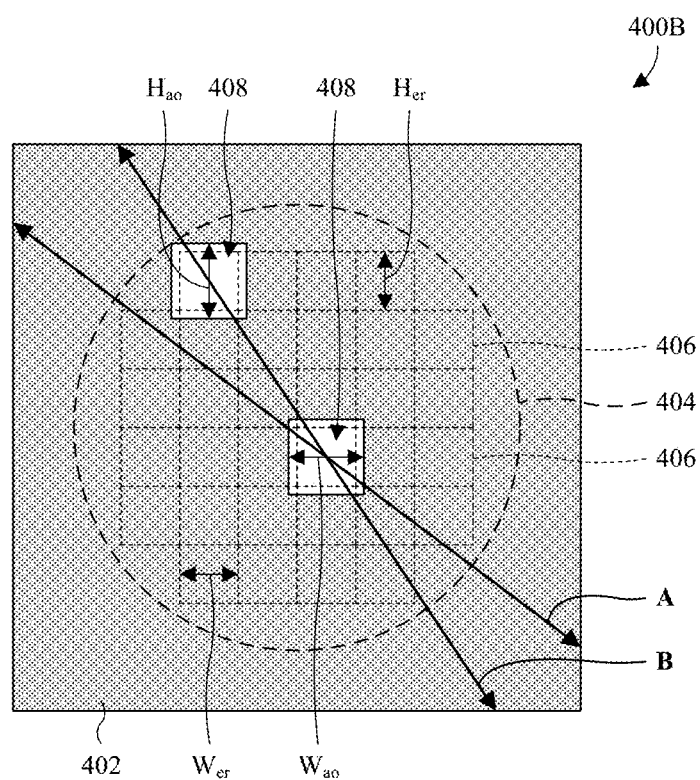

With reference to FIG. 4B, a top layout 400B of some alternative embodiments of the workpiece stage 402 of FIG. 4A is provided in which the alignment openings 408 are larger than the exposure regions 406 of the workpiece 404. In other words, the width $W_{ao}$ of the alignment openings 408 greater than the width $W_{er}$ of the exposure regions 406, and/or the height $H_{ao}$ of the alignment openings 408 is greater than the height $H_{er}$ of the exposure regions 406.

Figure 5:
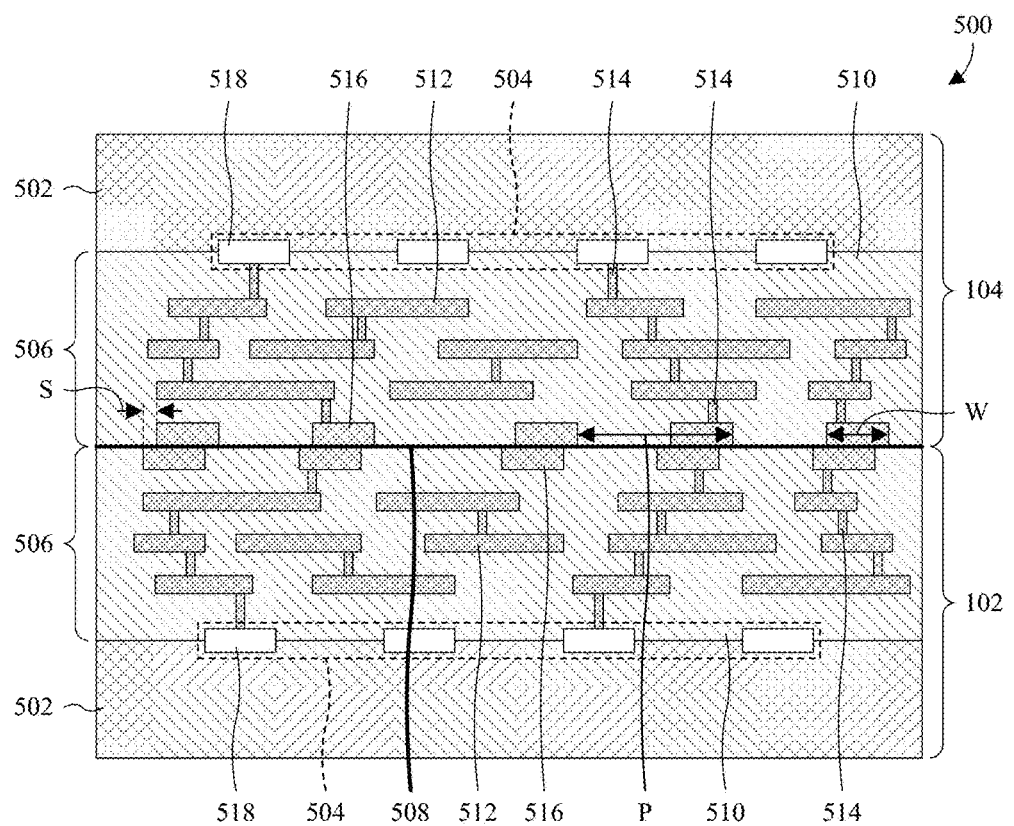
FIG. 5 illustrates a cross-sectional view of some embodiments of a three-dimensional integrated circuit (3DIC) chip comprising workpieces aligned by the bond tool in any one of FIGS. 1A, 1B, 2A, and 2B.

With reference to FIG. 5, a cross-sectional view 500 of some embodiments of a three-dimensional integrated circuit (3DIC) chip formed by the bond tool in any one of FIGS. 1A, 1B, 2A, and 2B is provided. The lower workpiece 102 and the upper workpiece 104 comprise corresponding semiconductor substrates 502, corresponding device layers 504, and corresponding interconnect structures 506. The semiconductor substrates 502 may, for example, be bulk monocrystalline silicon substrates, silicon-on-insulator (SOI) substrates, or some other semiconductor substrates.

The interconnect structures 506 are between the semiconductor substrates 502 and contact at a bond interface 508. The interconnect structures 506 comprise corresponding interconnect dielectric layers 510, corresponding wires 512, corresponding vias 514, and corresponding pads 516. For ease of illustration, only some of the wires 512 are labeled 512, only some of the vias 514 are labeled 514, and only some of the pads 516 are labeled 516. The interconnect dielectric layers 510 contact at the bond interface 508, and the pads 516 contact at the bond interface 508. The wires 512 and the vias 514 are alternatingly stacked in the interconnect dielectric layers 510 to define conductive paths electrically coupling the device layers 504 to the pads 516. The wires 512, the vias 514, and the pads 516 are conductive and may, for example, be or comprise copper, aluminum copper, some other metal, some other conductive material, or any combination of the foregoing. The device layers 504 are between, and respectively on, the semiconductor substrates 502. Further, the device layers 504 are separated from the bond interface 508 respectively by the interconnect structures 506. The device layers 504 comprise corresponding semiconductor devices 518. For ease of illustration, only some of the semiconductor devices 518 are labeled 518. The semiconductor devices 518 may, for example, be metal-oxide-semiconductor (MOS) field-effect transistors (FETs), some other MOS devices, insulated-gate FETs, some other semiconductor devices, or any combination of the foregoing.

By using the bond tool in any one of FIGS. 1A, 1B, 2A, and 2B to bond the lower and upper workpieces 102, 104 together, alignment shift S between pads adjoining at the bond interface 508 is low. For example, the alignment shift S may be less than about 30, 35, or 40 nanometers. Because the alignment shift S is low, alignment accuracy between the lower and upper workpieces 102, 104 is high. Further, the pitch P between the pads 516 may, for example, be reduced and/or the width W of the pads 516 may, for example, be reduced. This may, for example, allow the 3DIC chip to be reduced in size.

Figure 6A:
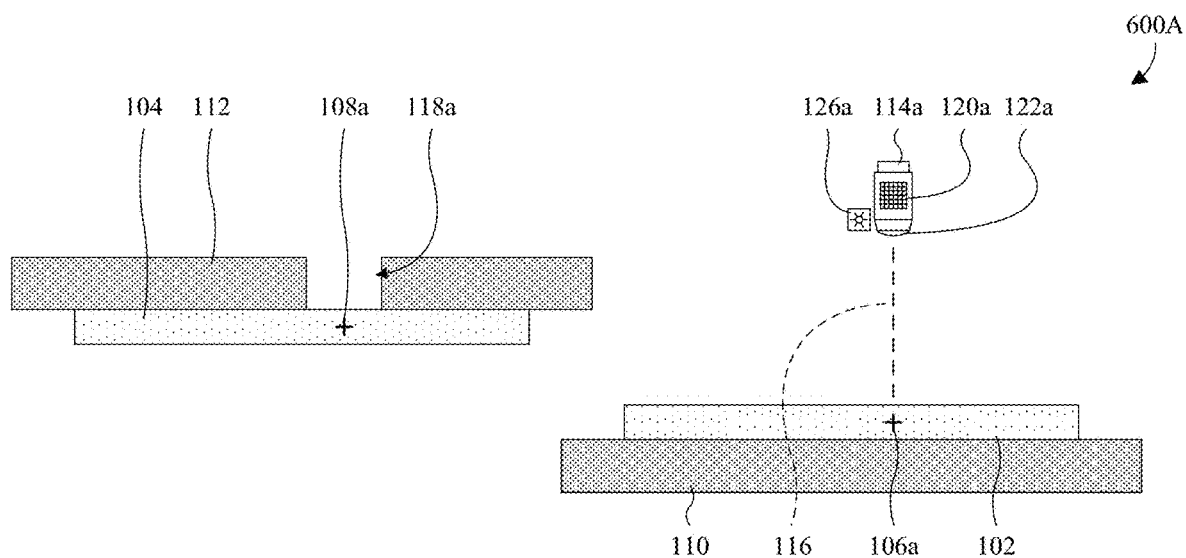
FIGS. 6A-6C illustrate cross-sectional schematic diagrams of some embodiments of a bond tool at various stages of a method for workpiece-level alignment and bonding.
Figure 6B:
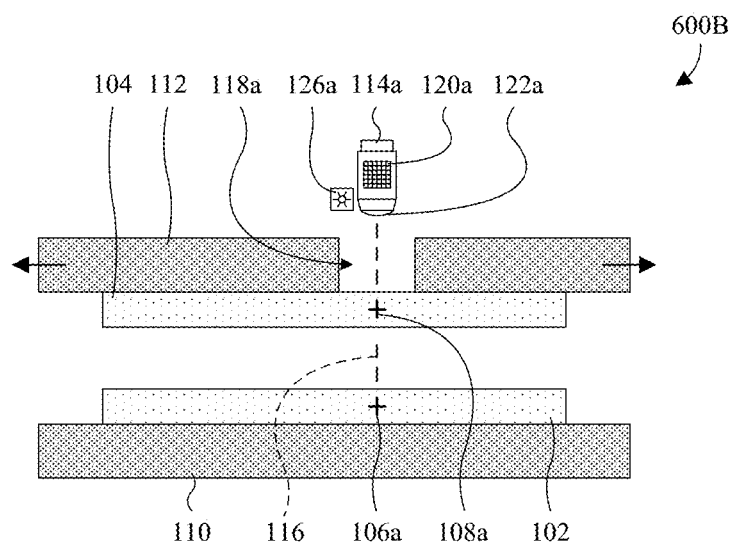
Figure 6C:
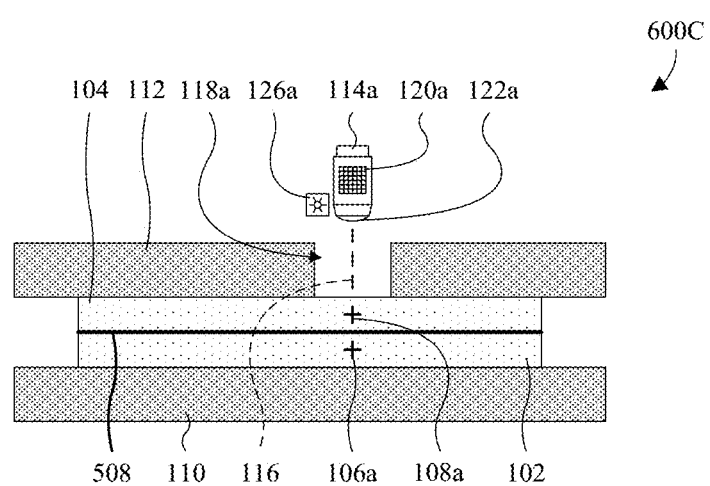

With reference to FIGS. 6A-6C, cross-sectional schematic diagrams 600A-600C of some embodiments of a bond tool at various stages of a method for workpiece-level alignment and bonding are provided. As seen, the cross-sectional schematic diagrams 600A-600C use embodiments of the bond tool in FIG. 1A. Notwithstanding this, embodiments of the bond tool in FIG. 2A or other embodiments of the bond tool may alternatively be used. Further, while the cross-sectional schematic diagrams 600A-600C shown in FIGS. 6A-6C are described with reference to a method, it will be appreciated that the structures shown in FIGS. 6A-6C are not limited to the method and may stand alone without the method.

As illustrated by the cross-sectional schematic diagram 600A of FIG. 6A, an upper workpiece 104 is placed on an upper workpiece stage 112. In some embodiments, the upper workpiece 104 is placed on an underside of the upper workpiece stage 112. In other embodiments, the upper workpiece 104 is placed on an upper side of the upper workpiece stage 112, and then the upper workpiece stage 112 is flipped vertically to arrive at the orientation shown in FIG. 6A. The upper workpiece 104 comprises an upper alignment mark 108a and may, for example, be or comprise a semiconductor wafer or some other substrate. The upper alignment mark 108a may, for example, be cross shaped or some other shape. Further, the upper alignment mark 108a may, for example, be or comprise copper, some other metal, or some other material that reflects and/or blocks radiation 116 sensed by an imaging device 114a.

In some embodiments, the upper workpiece stage 112 defines an upper alignment opening 118a. The upper alignment opening 118a allows the radiation 116 sensed by the imaging device 114a to pass through the upper workpiece stage 112 in embodiments in which the radiation 116 would otherwise be unable to do so. As seen hereafter, the radiation 116 may, for example, be or comprise infrared radiation or some other radiation capable of passing through the upper workpiece 104, but not the upper alignment mark 108a. In embodiments in which the upper workpiece stage 112 defines the upper alignment opening 118a, the upper workpiece 104 is placed on the upper workpiece stage 112 so the upper alignment mark 108a is aligned to the upper alignment opening 118a. This, in turn, allows the upper alignment mark 108a to be viewed by the imaging device 114a through the upper workpiece stage 112.

Also illustrated by the cross-sectional schematic diagram 600A of FIG. 6A, a lower workpiece 102 is placed on a lower workpiece stage 110 and aligned to a FOV of the imaging device 114a. In some embodiments, the aligning is performed at atmospheric pressure or some other pressure. The lower workpiece 102 comprises a lower alignment mark 106a to facilitate alignment and may, for example, be or comprise a semiconductor wafer or some other substrate. The lower alignment mark 106a may, for example, be cross shaped or some other shape, and/or may, for example, be the same shape as the upper alignment mark 108a. Further, the lower alignment mark 106a may, for example, be or comprise copper, metal, or some other material that reflects and/or blocks the radiation 116 sensed by an imaging device 114a. The imaging device 114a may, for example, be configured to sense reflections of the radiation 116 to perform imaging and/or may, for example, comprise a lens 122a to focus incident radiation on an image sensor 120a of the imaging device 114a.

In some embodiments, a process for aligning the lower workpiece 102 to the FOV of the imaging device 114a comprises laterally moving the lower workpiece 102 with the lower workpiece stage 110 until the lower alignment mark 106a is in, and aligned to, the FOV of the imaging device 114a. In some of such embodiments, the FOV and, hence, the imaging device 114a remain stationary. In other embodiments, a process for aligning the lower workpiece 102 to the FOV of the imaging device 114a comprises laterally moving the imaging device 114a and, hence, the FOV until the lower alignment mark 106a is in, and aligned to, the FOV of the imaging device 114a. In some of such embodiments, the lower workpiece 102 and hence the lower workpiece stage 110 remain stationary. In yet other embodiments, a process for aligning the lower workpiece 102 to the FOV of the imaging device 114a comprises using the lens 122a to optically move and/or manipulate the FOV until the lower alignment mark 106a is in, and aligned to, the FOV. In some of such embodiments, the imaging device 114a and the lower workpiece 102 remain stationary.

Regardless of which process is performed to align the lower workpiece 102 to the FOV of the imaging device 114a, the relative positions of the FOV and the lower alignment mark 106a are varied based on feedback from the imaging device 114a. The relative positions may, for example, be varied in a searching pattern until the lower alignment mark 106a is located within the FOV, as determined from the feedback, and then the relative positions may, for example, be varied into alignment based on the feedback. The searching pattern may, for example, be or comprise a serpentine pattern or some other pattern.

In some embodiments, the upper workpiece stage 112 is moved outside the FOV of the imaging device 114a before the aligning of the lower workpiece to the FOV of the imaging device 114a so the upper workpiece stage 112 does not block the imaging device 114a from viewing the lower alignment mark 106a. In some embodiments, a radiation source 126a illuminates the FOV of the imaging device 114a during the aligning of the lower workpiece 102 to the FOV so the imaging device 114a can better view the lower alignment mark 106a.

As illustrated by the cross-sectional view 600B of FIG. 6B, the upper workpiece 104 is aligned to the lower workpiece 102, such that the upper alignment mark 108a overlies and is aligned to the lower alignment mark 106a. In some embodiments, the aligning is performed at atmospheric pressure or some other pressure. In some embodiments, a process for aligning the upper workpiece 104 to the lower workpiece 102 comprises moving the upper workpiece 104 laterally with the upper workpiece stage 112 until the upper alignment mark 108a is in the FOV of the imaging device 114a and is aligned with the lower alignment mark 106a. In some embodiments, the lower workpiece stage 110 remains fixed while the upper workpiece stage 112 moves the upper workpiece 104 into the FOV and into alignment. In some embodiments, the FOV and the lens 122a remain fixed while the upper workpiece stage 112 moves the upper workpiece 104 into the FOV and into alignment. In some embodiments, the lower and upper alignment marks 106a, 108a are the same shape and the same size, and alignment occurs when the upper alignment mark 108a completely covers the lower alignment mark 106a.

In some embodiments, the moving of the upper workpiece 104 is blind until the upper alignment mark 108a reaches the FOV of the imaging device 114a since the imaging device 114a is unable to view the upper alignment mark 108a. Therefore, the moving may initially be performed to a location approximately aligned with the lower alignment mark 106a. The approximately aligned location may, for example, be determined from memory or determined by translation of the known location of the lower alignment mark 106a to a coordinate system of the upper workpiece stage 112. After the upper alignment mark 108a reaches the FOV, the moving is based on feedback from the imaging device 114a. As noted above, the radiation 116 sensed by the imaging device 114a (e.g., infrared radiation) is capable of passing through the upper workpiece 104, whereby the imaging device 114a may view the lower alignment mark 106a through the upper workpiece 104. Therefore, after the upper alignment mark 108a reaches the FOV, the imaging device 114a may concurrently view both the lower and upper alignment marks 106a, 108a and may hence guide the moving of the upper workpiece 104 based on real-time feedback on the locations of the lower and upper alignment marks 106a, 108a. Because of the real-time feedback on the locations of the lower and upper alignment marks 106a, 108a, alignment accuracy is high (i.e., alignment error is low) and the number of mechanical movements to perform alignment is low. The low number of mechanical movements, in turn, leads to high throughput and a low cost of ownership.

As illustrated by the cross-sectional view 600C of FIG. 6C, the lower workpiece stage 110 and/or the upper workpiece stage 112 move the lower and upper workpieces 102, 104 into contact. For example, while upper workpiece stage 112 remains fixed, the lower workpiece stage 110 may be move vertically until the lower workpiece 102 is in contact with the upper workpiece 104. In some embodiments, while the lower and upper workpieces 102, 104 are moved into contact, additional alignment is performed between the lower and upper alignment marks 106a, 108a. The additional alignment may, for example, comprise laterally moving the lower workpiece 102 and/or laterally moving the upper workpiece 104 so the lower and upper alignment marks 106a, 108a are better aligned. As above, the additional alignment is based on real-time feedback on the locations of the lower and upper alignment marks 106a, 108a since the imaging device 114a may view the lower alignment mark 106a through the upper workpiece 104. This additional alignment further enhances alignment accuracy.

Also illustrated by the cross-sectional view 600C of FIG. 6C, the lower and upper workpieces 102, 104 are bonded together at a bond interface 508 once the lower and upper workpieces 102, 104 are in contact. The bonding may, for example, be performed by fusion bonding, hybrid bonding, some other bonding, or any combination of the foregoing. In some embodiments, an anneal is performed after the bonding to strengthen the bond. Further, in some embodiments, the bonding is performed at atmospheric pressure or some other pressure.

Figure 7A:
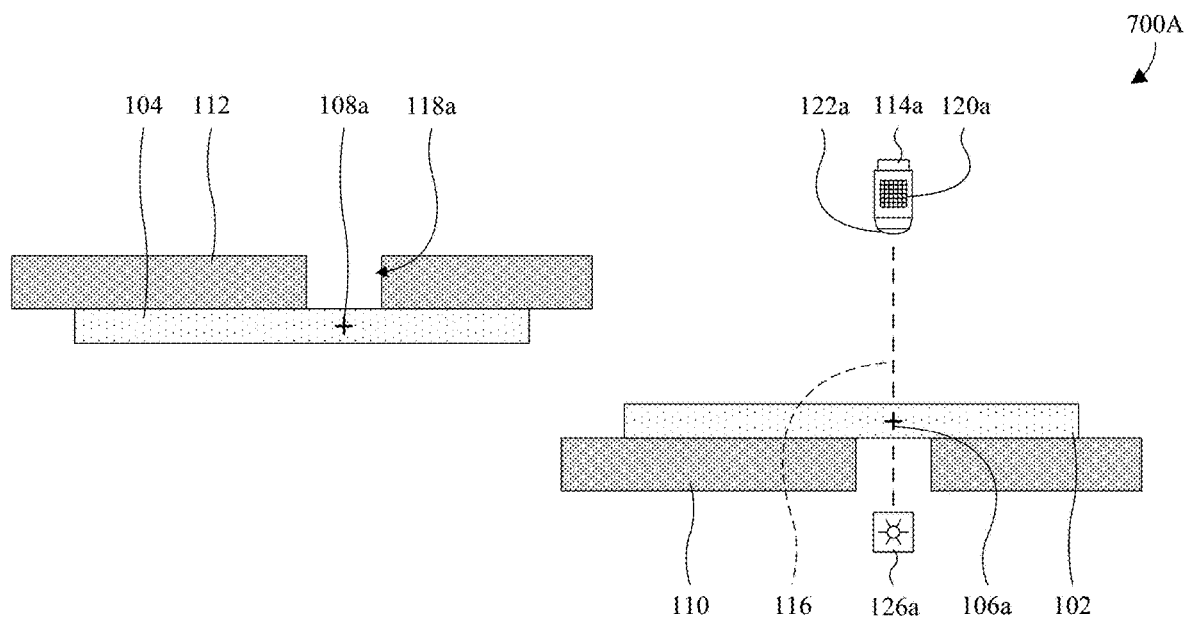
FIGS. 7A-7C illustrate cross-sectional schematic diagrams of some alternative embodiments of the bond tool of FIGS. 6A-6C at various stages of the method of FIGS. 6A-6C.
Figure 7B:
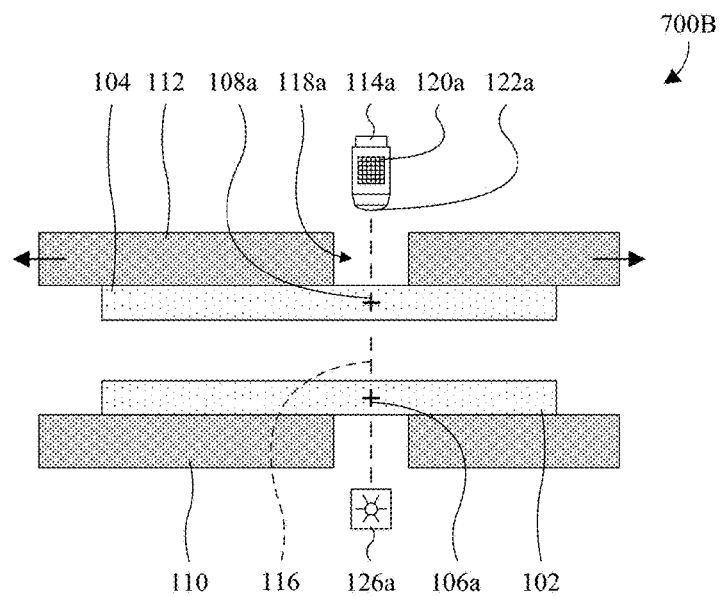
Figure 7C:
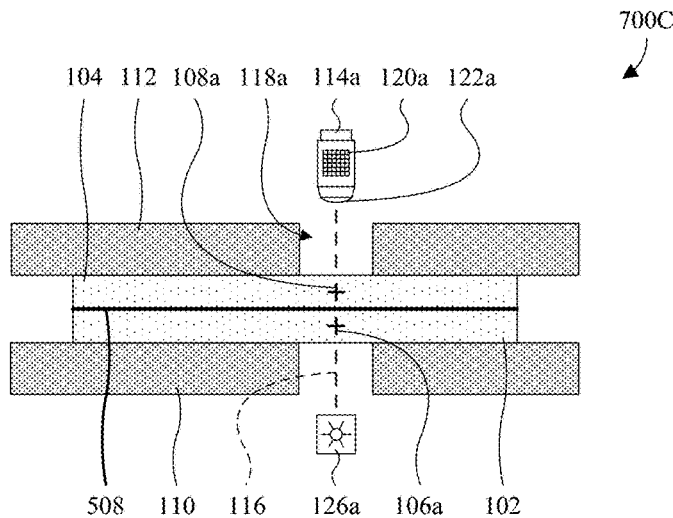

With reference to FIGS. 7A-7C, cross-sectional schematic diagrams 700A-700C of some alternative embodiments of the bond tool of FIGS. 6A-6C at various stages of the method of FIGS. 6A-6C are provided. As seen, the cross-sectional schematic diagrams 700A-700C use embodiments of the bond tool in FIG. 1B. Notwithstanding this, embodiments of the bond tool in FIG. 2B or other embodiments of the bond tool may alternatively be used. Further, while the cross-sectional schematic diagrams 700A-700C shown in FIGS. 7A-7C are described with reference to a method, it will be appreciated that the structures shown in FIGS. 7A-7C are not limited to the method and may stand alone without the method.

The cross-sectional schematic diagrams 700A-700C of FIGS. 7A-7C are respectively as cross-sectional schematic diagrams 600A-600C of FIGS. 6A-6C are described, except that: 1) the radiation source 126a is below the lower workpiece stage 110; and 2) the lower workpiece stage 110 has a different configuration in some embodiments. Radiation emitted by the radiation source 126a is incapable of passing through the lower workpiece stage 110 in some embodiments. In such embodiments, the lower workpiece stage 110 defines a lower alignment opening 128a extending through the lower workpiece stage 110 to allow the emitted radiation to pass through the lower workpiece stage 110 and to illuminate the FOV of the imaging device 114a. At FIG. 7A, the lower workpiece 102 is placed on the lower workpiece stage 110 so the lower alignment mark 106a is aligned with the lower alignment opening 128a.

While FIGS. 6A-6C and 7A-7C illustrated and described alignment using a single alignment location, it is to be appreciated that more alignment locations may be employed for enhanced alignment. For example, with two alignment locations, the lower and upper workpieces 102, 104 may be rotationally aligned.

Figure 8:
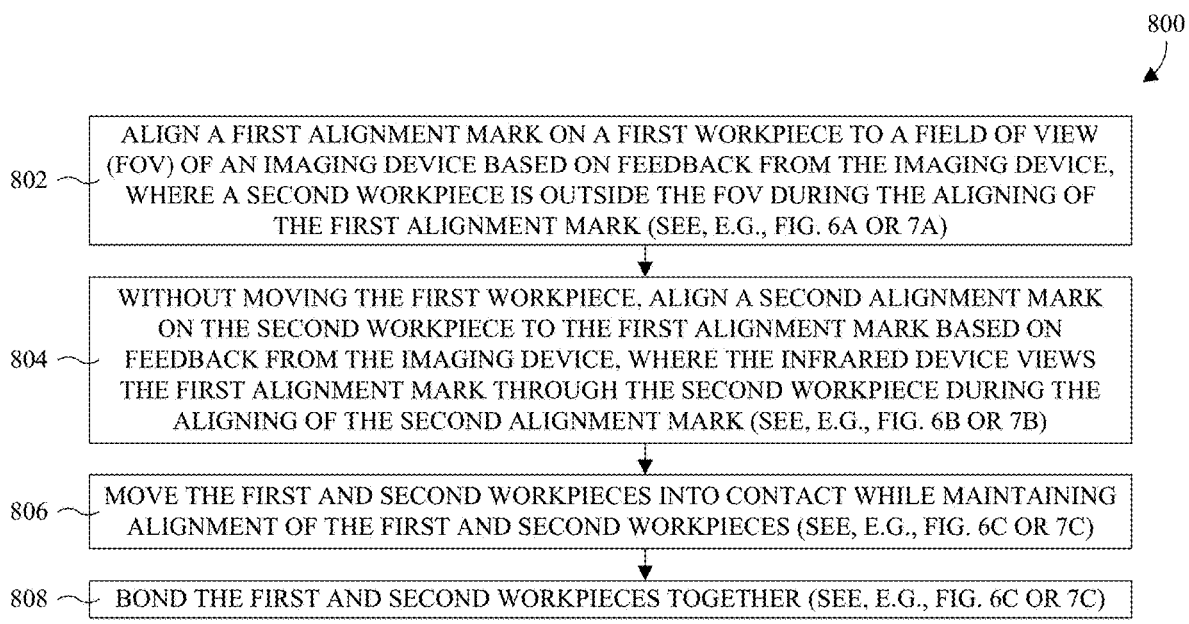
FIG. 8 illustrates a block diagram of some embodiments of the method of FIGS. 6A-6C and 7A-7C.

With reference to FIG. 8, a block diagram 800 of some embodiments of the method of FIGS. 6A-6C and 7A-7C is provided.

At 802, a first alignment mark on a first workpiece is aligned to a FOV of an imaging device based on feedback from the imaging device, where a second workpiece is outside the FOV during the aligning of the first alignment mark. See, for example, FIG. 6A or 7A. During the aligning of the first alignment mark, the relative positions of the first alignment mark and the FOV may, for example, be varied in a searching pattern until the first alignment mark is located within the FOV, as determined from the feedback, and then the relative positions may, for example, be varied into alignment based on the feedback.

At 804, without moving the first workpiece and the FOV, a second alignment mark on the second workpiece is aligned to the first alignment mark based on feedback from the imaging device, where the imaging device views and/or images the first alignment mark through the second workpiece during the aligning of the second alignment mark. See, for example, FIG. 6B or 7B. In some embodiments, the imaging device employs infrared radiation to view the first alignment mark through the second workpiece. During the aligning of the second alignment mark, the relative positions of the second alignment mark and the FOV may, for example, be varied until the second alignment mark is within the FOV, as determined from the feedback, and then the relative positions first and second alignment marks may be varied into alignment based on the feedback.

Because the imaging device may view the first alignment mark through the second workpiece, the first and second alignment marks may be concurrently viewed and/or images. Further, alignment between the first and second alignment marks may be based on real time feedback on the locations of the first and second alignment marks. As a result, alignment accuracy is high (i.e., alignment error is low) and the number of mechanical movements to perform alignment is low. The low number of mechanical movements, in turn, leads to high throughput and a low cost of ownership.

At 806, the first and second workpiece are moved into contact while maintaining alignment of the first and second workpiece. See, for example, FIG. 6C or 7C.

At 808, the first and second workpiece are bonded together. See, for example, FIG. 6C or 7C. The bonding may, for example, be performed by fusion bonding, hybrid bonding, or some other bonding.

While the block diagram 800 of FIG. 8 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 9:
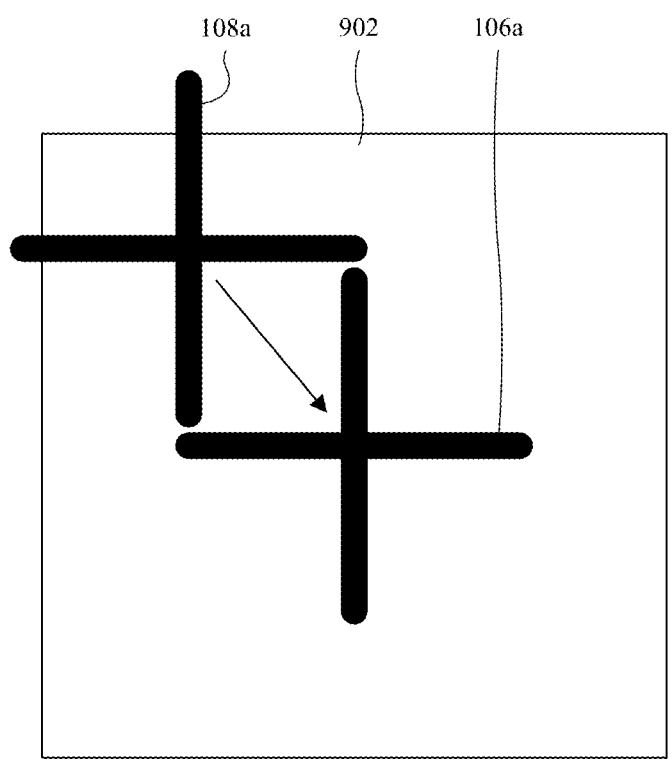
FIG. 9 illustrates alignment between alignment marks in FIGS. 6A-6C and 7A-7C according to some embodiments.

With reference to FIG. 9, alignment between the lower and upper alignment marks 106a, 108a in FIGS. 6A-6C and 7A-7C is illustrated according to some embodiments. The lower alignment mark 106a is aligned to the FOV 902 of the imaging device 114a in FIGS. 6A-6C and 7A-7C. Examples of this alignment process are described at FIGS. 6A and 7A. Further, the upper alignment mark 108a is moved into alignment with the lower alignment mark 106a based on feedback from the imaging device 114a. Examples of this alignment process are described at FIGS. 6B and 7B. Since both the lower and upper alignment marks 106a, 108a are in the FOV 902, both the lower and upper alignment marks 106a, 108a are visible to the imaging device 114a. Therefore, the upper alignment mark 108a is moved based on feedback from the imaging device 114a that describes the locations of both the lower and upper alignment marks 106a, 108a relative to each other. This, in turn, enables high alignment accuracy.

In some embodiments, the present application provides a method for alignment including: aligning a first alignment mark on a first workpiece to a FOV of an imaging device based on feedback from the imaging device, wherein a second workpiece is outside the FOV during the aligning of the first alignment mark; and aligning a second alignment mark on the second workpiece to the first alignment mark based on feedback from the imaging device, wherein the aligning of the second alignment mark is performed without moving the first alignment mark out of the FOV, and wherein the imaging device images the first alignment mark through the second workpiece during the aligning of the second alignment mark. In some embodiments, the imaging device images the first and second alignment marks with infrared radiation. In some embodiments, the first workpiece is on an upper side of a first workpiece stage, wherein the second workpiece is on an under side of a second workpiece stage, and wherein the aligning of the second alignment mark includes controlling the second workpiece stage to laterally move the second alignment mark into alignment with the first alignment mark. In some embodiments, the second workpiece stage defines an opening over the second workpiece, wherein the aligning of the second alignment mark includes imaging the first alignment mark through both the opening and the second workpiece using the imaging device. In some embodiments, the aligning of the first alignment mark includes manipulating the FOV with an optical lens to locate the first alignment mark while the imaging device and the first workpiece are stationary. In some embodiments, the method further includes: after the aligning of the second alignment mark, raising the first workpiece until directly contacting the second workpiece; and bonding the first and second workpieces together. In some embodiments, the aligning of the first alignment mark and the aligning of the second alignment mark are performed at atmospheric pressure. In some embodiments, the method further includes aligning a third alignment mark on the first workpiece to a second FOV of a second imaging device based on feedback from the second imaging device, wherein the aligning of the first alignment mark and the aligning of the third alignment mark are performed simultaneously. In some embodiments, the method further includes aligning a fourth alignment mark on the second workpiece to the third alignment mark based on feedback from the second imaging device, wherein the aligning of the fourth alignment mark is performed simultaneously with the aligning of the second alignment mark, and wherein the second imaging device images the third alignment mark through the second workpiece during the aligning of the fourth alignment mark.

In some embodiments, the present application provides a process tool including: a first workpiece stage configured to support a first workpiece over the first workpiece stage, and further configured to move the first workpiece; a second workpiece stage configured to support a second workpiece under the second workpiece stage, and further configured to move the second workpiece, wherein the second workpiece stage is elevated relative to the first workpiece stage; an imaging device over the second workpiece stage; and a controller configured to control the second workpiece stage to align a second alignment mark on the second workpiece to a first alignment mark on the first workpiece based on feedback from the imaging device, wherein the imaging device is configured to image the first alignment mark through the second workpiece while aligning the second alignment mark to the first alignment mark. In some embodiments, the imaging device is configured to generate the feedback using infrared radiation. In some embodiments, the second workpiece stage defines an opening, and wherein the imaging device is configured to image the first alignment mark through both the second workpiece and the opening while aligning the second alignment mark to the first alignment mark. In some embodiments, the process tool further includes a radiation source over the second workpiece stage and configured to illuminate the first and second workpieces through the opening. In some embodiments, the first workpiece stage defines an opening, wherein the process tool further includes: a radiation source under the first workpiece stage and configured to illuminate the first and second workpieces through the opening. In some embodiments, the imaging device includes an image sensor and an optical lens, wherein the optical lens is configured to focus incident radiation on the image sensor. In some embodiments, the controller is further configured to control the optical lens to manipulate a FOV of the imaging device until the first alignment mark is aligned to the FOV. In some embodiments, the process tool further includes a second imaging device over the second workpiece stage, wherein the controller is further configured to control the second workpiece stage to align a fourth alignment mark on the second workpiece to a third alignment mark on the first workpiece based on feedback from the second imaging device, and wherein the second imaging device is configured to view the third alignment mark through the second workpiece while aligning the fourth alignment mark to the third alignment mark.

In some embodiments, the present application provides a method for wafer-level alignment, the method including: manipulating a FOV of an imaging device using an optical lens until a first alignment mark on a first workpiece is aligned to the FOV, wherein a second workpiece is elevated above the first workpiece and is outside the FOV during the manipulating; and moving the second workpiece laterally until a second alignment mark on the second workpiece is aligned to the first alignment mark based on images from the imaging device, wherein the moving of the second workpiece is performed without moving the first alignment mark out of the FOV, and wherein the imaging device images the first alignment mark through the second workpiece during the moving of the second workpiece. In some embodiments, the method further includes performing infrared imaging during the moving to generate the images, wherein the images concurrently capture the first and second alignment marks. In some embodiments, the moving of the second workpiece is performed by a workpiece stage overlying the second workpiece, wherein the workpiece stage defines an opening over the second workpiece, and wherein the imaging device images the first alignment mark through both the opening and the second workpiece during the moving of the second workpiece.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for alignment comprising:
 aligning a first alignment mark on a first workpiece to a field of view (FOV) of an imaging device based on feedback from the imaging device, wherein the aligning of the first alignment mark comprises moving the first alignment mark and the first workpiece until the first alignment mark is localized within the FOV, wherein the aligning of the first alignment mark is performed while the FOV and the imaging device are stationary, and wherein a second workpiece is outside the FOV during the aligning of the first alignment mark; and
 aligning a second alignment mark on the second workpiece to the first alignment mark based on feedback from the imaging device, wherein the aligning of the second alignment mark is performed without moving the first alignment mark out of the FOV, and wherein the imaging device images the first alignment mark through the second workpiece during the aligning of the second alignment mark.

2. The method according to claim 1, wherein the imaging device images the first and second alignment marks with infrared radiation.

3. The method according to claim 1, wherein the first workpiece is on an upper side of a first workpiece stage, wherein the second workpiece is on an under side of a second workpiece stage, and wherein the aligning of the second alignment mark comprises controlling the second workpiece stage to laterally move the second alignment mark into alignment with the first alignment mark.

4. The method according to claim 3, wherein the second workpiece stage defines an opening over the second workpiece, and wherein the aligning of the second alignment mark comprises imaging the first alignment mark through both the opening and the second workpiece using the imaging device.

5. The method according to claim 3, wherein the first workpiece stage has a continuous portion devoid of openings that underlies the first alignment mark during the aligning of the first alignment mark.

6. The method according to claim 1, further comprising:
 after the aligning of the second alignment mark, raising the first workpiece until directly contacting the second workpiece; and
 bonding the first and second workpieces together.

7. The method according to claim 1, wherein the aligning of the first alignment mark and the aligning of the second alignment mark are performed at atmospheric pressure.

8. The method according to claim 1, further comprising:
 aligning a third alignment mark on the first workpiece to a second FOV of a second imaging device based on feedback from the second imaging device, wherein the aligning of the first alignment mark and the aligning of the third alignment mark are performed simultaneously.

9. The method according to claim 8, further comprising:
 aligning a fourth alignment mark on the second workpiece to the third alignment mark based on feedback from the second imaging device, wherein the aligning of the fourth alignment mark is performed simultaneously with the aligning of the second alignment mark, and wherein the second imaging device images the third alignment mark through the second workpiece during the aligning of the fourth alignment mark.

10. The method according to claim 1, wherein a second workpiece stage defines an opening over the second workpiece, wherein the aligning of the second alignment mark comprises imaging the first alignment mark through both the opening and the second workpiece using the imaging device, and wherein the method further comprises:
 scanning or stepping across the second workpiece, and individually exposing multiple exposure regions to patterned radiation, using a photolithography stepper or scanner before the aligning of the first and second alignment marks, and wherein a width of the opening is greater than or equal to that of an exposure region.

11. A process tool comprising:
 a first workpiece stage configured to support a first workpiece over the first workpiece stage, and further configured to move the first workpiece, wherein the first workpiece stage has a continuous portion devoid of openings;
 a second workpiece stage configured to support a second workpiece under the second workpiece stage, and further configured to move the second workpiece, wherein the second workpiece stage is elevated relative to the first workpiece stage and defines an opening extending completely through the second workpiece stage;

a radiation source over the second workpiece stage and configured to emit radiation towards the first workpiece stage through the opening, and wherein the continuous portion of the first workpiece stage is configured to block the radiation from passing through the first workpiece stage;

an imaging device over the second workpiece stage and configured to sense reflections of the radiation; and a controller configured to control the second workpiece stage to align a second alignment mark in the second workpiece to a first alignment mark in the first workpiece based on feedback from the imaging device, wherein the imaging device is configured to image the first alignment mark through both the second workpiece and the opening while aligning the second alignment mark to the first alignment mark and while the first alignment mark overlies the continuous portion of the first workpiece stage.

12. The process tool according to claim 11, wherein the imaging device is configured to generate the feedback using infrared radiation.

13. The process tool according to claim 11, wherein the imaging device comprises an image sensor and an optical lens, and wherein the optical lens is configured to focus incident radiation on the image sensor.

14. The process tool according to claim 13, wherein the controller is further configured to control the optical lens to manipulate a field of view (FOV) of the imaging device until the first alignment mark is aligned to the FOV.

15. The process tool according to claim 11, further comprising a second imaging device over the second workpiece stage, wherein the controller is further configured to control the second workpiece stage to align a fourth alignment mark on the second workpiece to a third alignment mark on the first workpiece based on feedback from the second imaging device, and wherein the second imaging device is configured to view the third alignment mark through the second workpiece while aligning the fourth alignment mark to the third alignment mark.

16. A method for wafer-level alignment, the method comprising:

manipulating a field of view (FOV) of an imaging device using an optical lens until a first alignment mark on a first workpiece is aligned to the FOV, wherein a second workpiece is elevated above the first workpiece and is outside the FOV during the manipulating;

performing a first moving process to move the second workpiece laterally until a second alignment mark on the second workpiece is aligned to the first alignment mark based on first images from the imaging device, wherein the first moving process is performed without moving the first alignment mark out of the FOV and achieves a first alignment accuracy between the first and second alignment marks, and wherein the imaging device images the first alignment mark through the second workpiece during the first moving process; and after the first moving process completes, performing a second moving process to move the first workpiece and/or the second workpiece vertically into contact while simultaneously moving the first workpiece and/or the second workpiece laterally into greater alignment based on second images from the imaging device, wherein the second moving process achieves a second alignment accuracy between the first and second alignment marks that is greater than the first alignment accuracy.

17. The method according to claim 16, further comprising:

performing infrared imaging during the first moving process and the second moving process to generate the first and second images, wherein the first and second images concurrently capture the first and second alignment marks.

18. The method according to claim 16, wherein the first moving process and the second moving process are performed by a workpiece stage overlying the second workpiece, wherein the workpiece stage defines an opening over the second workpiece, and wherein the imaging device images the first alignment mark through both the opening and the second workpiece during the first moving process and the second moving process.

19. The method according to claim 16, wherein relative positions of the FOV and the first workpiece are varied in a serpentine pattern during the manipulating of the FOV.

20. The method according to claim 16, wherein the manipulating, the first moving process, and the second moving process are performed at atmospheric pressure.

\* \* \* \* \*